(12) United States Patent
Zhang et al.

(10) Patent No.: US 7,591,662 B2
(45) Date of Patent: Sep. 22, 2009

(54) ZERO INSERTION FORCE CONNECTOR FEARURING ROBUST INTERENGAGEMENT BETWEEN A BASE AND A COVER

(75) Inventors: Jie-Feng Zhang, ShenZhen (CN); Wen He, ShenZhen (CN); Qi-Jin Yi, ShenZhen (CN); Yao-Chi Huang, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/009,813

(22) Filed: Jan. 22, 2008

(65) Prior Publication Data

US 2008/0176438 A1 Jul. 24, 2008

(30) Foreign Application Priority Data

Jan. 22, 2007 (CN) .......................... 200720033812

(51) Int. Cl.
*H01R 4/50* (2006.01)

(52) U.S. Cl. .................................................... 439/342
(58) Field of Classification Search ................. 439/342, 439/266, 70, 259–265
See application file for complete search history.

(56) References Cited

U.S. PATENT DOCUMENTS 5,489,218 A * 2/1996 McHugh ..................... 439/342
6,530,797 B2 * 3/2003 Liao et al. ................... 439/342

* cited by examiner

*Primary Examiner*—Alexander Gilman
(74) *Attorney, Agent, or Firm*—Wei Te Chung

(57) ABSTRACT

A socket connector (1) for connecting an IC package to a printed circuit board includes a base (10) mounting a plurality of conductive terminals therein. A cover (13) assembled on the base (10) and sliding along a first direction relative to the base defines a pair of sidewalls (132, 133) extending downwardly therefrom. An actuating lever (14) drives the cover (13) sliding on the base (10). The sidewalls (132, 133) of the cover (13) are fitly engaging with corresponding sides (111, 112) of the base (10) except a releasing slot (1110, 1120) defined between part portion of the sidewall and the side.

8 Claims, 3 Drawing Sheets

ZERO INSERTION FORCE CONNECTOR FEARURING ROBUST INTERENGAGEMENT BETWEEN A BASE AND A COVER

BACKGROUND OF THE INVENTION

1. Field of the Invention

The present invention relates to a zero insertion force (ZIF) connector connecting an IC package such as CPU to a printed circuit board (PCB), and particularly to a socket connector featuring robust interengagement between a base and a cover thereof so as to provide a smooth movement of the cover with respect to the base.

2. Description of the Prior Art

U.S. Pat. No. 6,530,797 issued to Liao on Mar. 11, 2003 discloses a conventional ZIF socket connector, which comprises a base, a sliding cover and an actuating rob. The base defines a plurality of grooves therein for receiving conductive terminals. The sliding cover defines a pair of sidewalls extending downwardly therefrom, by which the cover is limited in a transverse direction and sliding along a longitudinal direction perpendicular to the transverse direction.

To ensure the cover and the base to move limitedly, the cover and the base are engaging with each other fitly. However, the base will dilate when the socket is soldering on the PCB through an oven, which may damage nice engagement of the cover and the base. Hence, a new design which can overcome the problem is required.

SUMMARY OF THE INVENTION

Accordingly, an object of the present invention is to provide a ZIF socket connector which can prevent deformation of the base.

In order to achieve the object set forth, a socket connector for connecting an IC package to a printed circuit board (PCB) comprises: a base mounting a plurality of conductive terminals therein; a cover assembled on the base and sliding along a first direction relative to the base, defining a pair of sidewalls extending downwardly therefrom; and an actuating lever driving the cover sliding on the base; wherein the sidewalls of the cover are fitly engaging with corresponding sides of the base except a releasing slot defined between part portion of the sidewall and the side.

Other objects, advantages and novel features of the invention will become more apparent from the following detailed description of the present embodiment when taken in conjunction with the accompanying drawings.

DETAILED DESCRIPTION OF THE INVENTION

Figure 1:
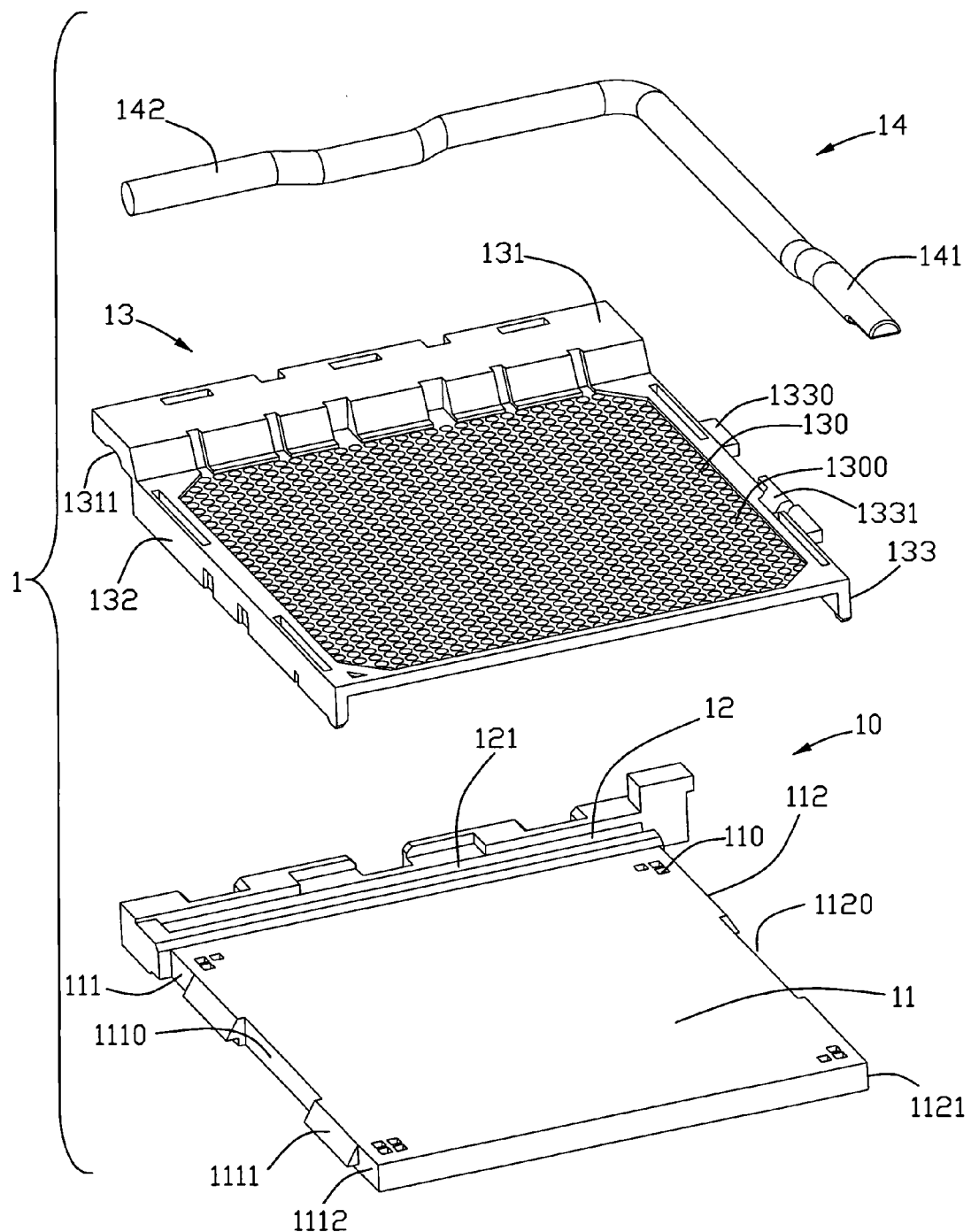
FIG. 1 is an exploded perspective view of a socket connector in accordance with the present invention.
Figure 2:
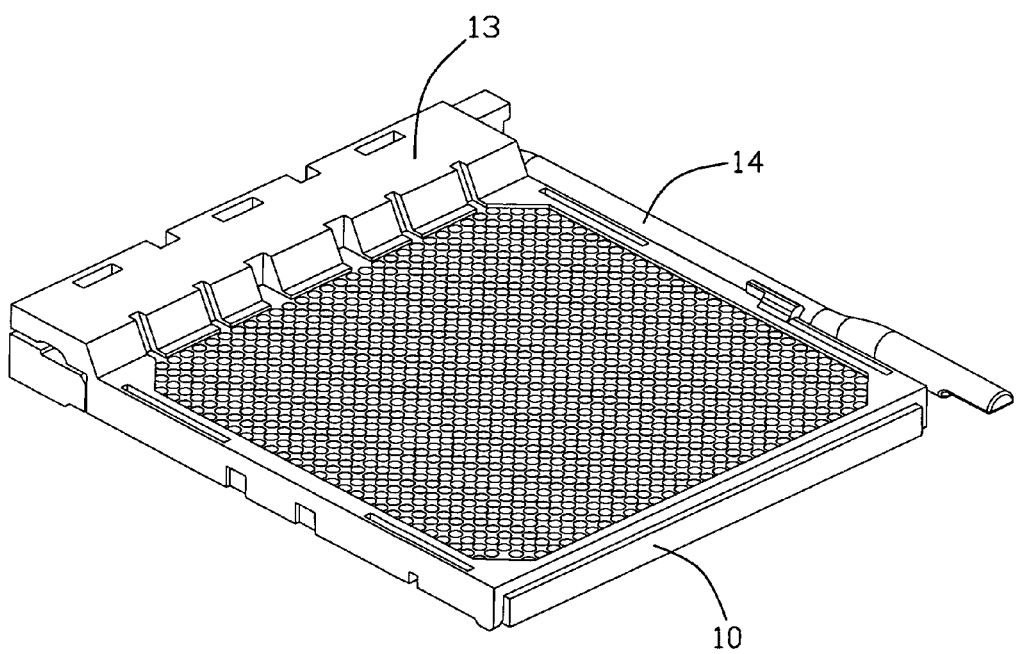
FIG. 2 is an assembled perspective view of the socket connector shown in FIG. 1.

Reference will now be made to the drawing figures to describe a preferred embodiment of the present invention in detail.

Referring to FIG. 1, a socket connector 1 in accordance with the present invention is adapted for electrically connecting an IC package, such as a CPU (not shown) to a PCB (not shown). The connector 1 comprises a base 10 mounting a plurality of conductive terminals therein, a cover 13 moveable assembled on the base 10 and a lever 14 received between the base 10 and the cover 13.

The base 10 defines a longitudinal direction and a transverse direction perpendicular to the longitudinal direction, the longitudinal direction and the transverse direction are also named as first direction and second direction. The base 10 comprises a rectangle base portion 11 and a mounting portion 12 in a rear end thereof. The base portion 11 defines a plurality of terminal grooves 110 for receiving the plurality of terminals. Two opposite sides 111,112 of the base 10 perpendicular to the mounting portion are defined as engaging faces, and the engaging faces are shorter than that of the mounting portions in the second direction parallel to the mounting portion. Each sides 111, 112 is substantially divided into three portions in the first direction, the middle portion is recessed inward in the second direction and defined as a recess 1110, 1120, namely, the front and rear portions of the base 10 along the second direction are wider than the middle portion. Two protrusions 1111 project outward from each side 111,112 adjacent the recess 1110. A lower receiving slot 121 is defined on an upper portion of the mounting portion 12 for accommodating the lever 14.

The cover 13 comprises a main body 130 and a head portion 131 extending from the rear end of the main body 130. The main body 130 and the head portion 131 are respectively corresponding and cooperating with the base portion 11 and the mounting portion 1,2 of the base 10. The main body 130 defines a plurality of holes 1300 corresponding with the terminals to receive the pins of the IC package when the IC package is installed. A pair of sidewalls 132,133 is respectively extending downwards from two opposite sides of the main body 130. An upper receiving slot 1311 is defined on a lower portion of the head portion for accommodating the lever 14. The lever 14 is substantially L-shaped and includes a handle portion 141 and a driving portion 142 extending from the handle potion 141. The driving portion 142 is received in the receiving slots 1311 and 121 when the head portion 131 and the mounting portion 12 are assembled together. The driving portion 142 drives the cover 13 sliding on the base 10 along a first direction relative to the base 10. The handle portion 141 is disposed along one side of the socket and limited by a supporting portion 1330 and a stopping portion 1331 respectively defined at a top and bottom portion of the sidewalls of the cover 13.

Figure 3:
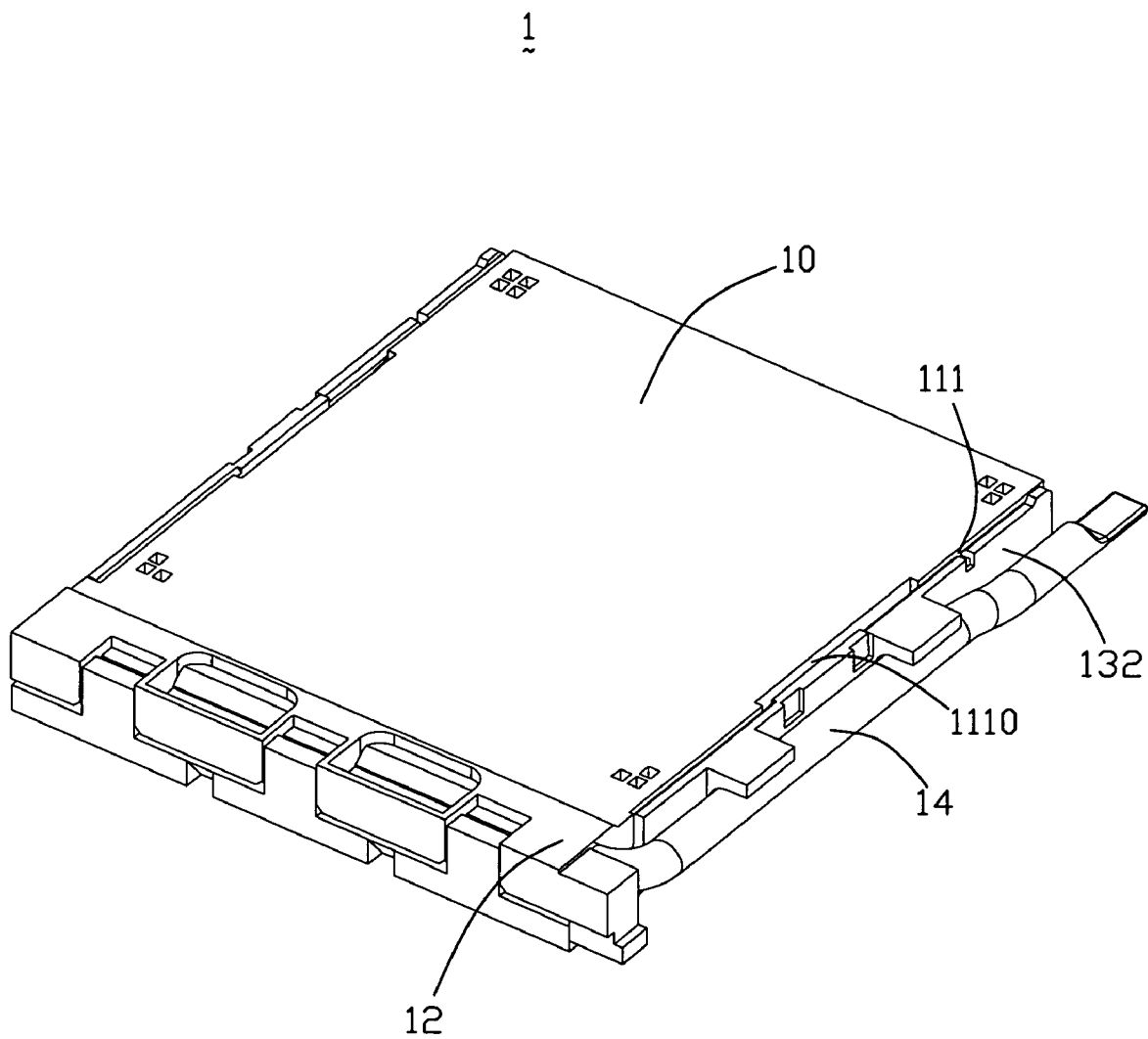
FIG. 3 is another assembled perspective view of the socket connector shown in FIG. 2.

As shown in FIG. 3, when the cover 13 is assembled on the base 10, the sidewalls 132,133 of the cover is fitly engaged with the sides 111, 112 of the base 10. The front and rear portions of the base 10 are interfering with the cover 13 by protrusions 1111 locked with the inner side of the sidewalls 132,133. As the recess 1110, 1120 in the middle portion of the base is shorter than the front and rear portions of the base in the second direction, a pair of releasing slots, namely the recess 1110, 1120 is respectively defined between the sidewalls 132,133 of the cover and sides 111, 112 of the base. The releasing slot can act as an existing room for releasing the soldering heat produced when the socket connector is mounting to the PCB, which can effectively prevent the base from distorting and ensure nice engagement between the base and the cover.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed. For example, the recess 1110, 1120 can be arranged at any engaging surface on the sidewalls 132, 133 or sides 111, 112. And the lever 14 can be changed into the other mechanism such as a cam or something like that.

What is claimed is:

1. A socket connector, comprising:
   an insulative base defining a head portion and a contact area having a top surface and a mounting surface with a plurality of passageways defined therebetween, at least two interlocking tabs protruding outwardly from each of two opposite outward facing side surfaces of the base, and spaced apart from each other in a front-to-back direction; and
   a cover having a supporting surface with two skirts extending downward therefrom and intimately inwardly confronting the corresponding side surfaces, respectively, and moveably and slidably assembled to the base; and
   an actuating lever pivotally disposed in the head portion, and interengaged with the cover so as to drive the cover to move with respect to the base;
   wherein at least one notch is recessed inwardly from each side surface of the base so as to define a releasing slot between an inner portion of the notch and the skirt of the cover.

2. The socket connector as described in claim 1, wherein the inner portion of the notch is inwardly farther from the skirt of the cover than the side surface of the base is.

3. The socket connector as described in claim 2, wherein the notch is located between said interlocking tabs.

4. The socket connector as described in claim 2, wherein the notch runs through the base from the top surface to the mounting surface.

5. The socket connector as described in claim 1, wherein a supporting portion and a stopping portion respectively protrude outwardly from a top and bottom portion of one skirt of the cover, and the lever is interengaged between the supporting portion and stopping portion.

6. The socket connector as described in claim 1, wherein a portion of a bottom edge of the skirt confronting the locking tab, is equipped with a chamfer structure to be compliantly engaged with an oblique upward face of the corresponding interlocking tab during downwardly assembling the cover to the base, while another portion of said bottom edge of the skirt confronting the corresponding notch instead of the interlocking tab, is not equipped with the chamfer structure so as to reinforce strength thereof.

7. A socket connector comprising:
   an insulative base defining a top face, a bottom face and two side walls, a plurality of terminal grooves extending between the top and bottom faces to receive a plurality of terminals therein, two interlocking tabs protruding outwards from each side wall of the base;
   a cover having a main body and two sidewalls perpendicular extending from the main body, the main body being located on the top face of the base and the sidewalls being fitly engaging with corresponding side walls of the base and being locked by the interlocking tabs; and
   a lever pivotally disposed on the base and driving the cover sliding with respect to the base;
   wherein each side wall of the base defines a releasing slot running therethrough from the top face to the bottom face.

8. The socket connector as described in claim 6, wherein the releasing slot is located between the interlocking tabs and faces to the sidewall of the cover.

* * * * *